United States Patent
Shin et al.

(10) Patent No.: US 10,541,668 B2
(45) Date of Patent: Jan. 21, 2020

(54) ACOUSTIC RESONATOR AND METHOD OF MANUFACTURING THE SAME

(71) Applicant: SAMSUNG ELECTRO-MECHANICS CO., LTD., Suwon-si (KR)

(72) Inventors: Ran Hee Shin, Suwon-si (KR); Tae Kyung Lee, Suwon-si (KR); Sung Han, Suwon-si (KR); Yun Sung Kang, Suwon-si (KR); Sung Sun Kim, Suwon-si (KR); Jin Suk Son, Suwon-si (KR); Jeong Suong Yang, Suwon-si (KR); Hwa Sun Lee, Suwon-si (KR); Eun Tae Park, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 620 days.

(21) Appl. No.: 15/085,072

(22) Filed: Mar. 30, 2016

(65) Prior Publication Data

US 2017/0179923 A1    Jun. 22, 2017

(30) Foreign Application Priority Data

Dec. 18, 2015  (KR) .................. 10-2015-0181490

(51) Int. Cl.
*H03H 9/17* (2006.01)
*H03H 3/02* (2006.01)
*H03H 9/02* (2006.01)

(52) U.S. Cl.
CPC .............. *H03H 9/173* (2013.01); *H03H 3/02* (2013.01); *H03H 9/02015* (2013.01); *H03H 9/174* (2013.01); *H03H 9/02118* (2013.01); *H03H 2003/021* (2013.01); *H03H 2003/023* (2013.01)

(58) Field of Classification Search
CPC ..................................................... H03H 9/173
See application file for complete search history.

(56) References Cited

U.S. PATENT DOCUMENTS

| | | | |
|---|---|---|---|
| 6,239,536 B1 | 5/2001 | Lakin | |
| 6,466,105 B1* | 10/2002 | Lobl | H03H 3/02 310/322 |
| 7,489,067 B2* | 2/2009 | Metzger | B65B 3/003 310/358 |

(Continued)

FOREIGN PATENT DOCUMENTS

| | | |
|---|---|---|
| CN | 1592100 A | 3/2005 |
| JP | 2004-64786 A | 2/2004 |

(Continued)

OTHER PUBLICATIONS

Japanese Office Action dated Jun. 13, 2017 in counterpart Japanese Patent Application No. 2016-075935 (7 pages, with English translation).

(Continued)

*Primary Examiner* — Thomas M Dougherty
*Assistant Examiner* — Karen B Addison
(74) *Attorney, Agent, or Firm* — NSIP Law

(57) ABSTRACT

An acoustic resonator and a method of manufacturing the same are provided. The acoustic resonator includes a resonating part including a first electrode, a second electrode, and a piezoelectric layer; and a plurality of seed layers disposed on one side of the resonating part.

17 Claims, 4 Drawing Sheets

(56) References Cited

U.S. PATENT DOCUMENTS

| | | | |
|---|---|---|---|
| 9,608,589 B2* | 3/2017 | Grannen | H03H 3/02 |
| 2004/0021400 A1* | 2/2004 | Bradley | H03H 3/02 |
| | | | 310/324 |
| 2005/0035828 A1 | 2/2005 | Kyoung et al. | |
| 2005/0046519 A1 | 3/2005 | Yokoyama et al. | |
| 2005/0185026 A1* | 8/2005 | Noguchi | B41J 2/161 |
| | | | 347/68 |
| 2012/0049976 A1 | 3/2012 | Son et al. | |
| 2012/0096697 A1 | 4/2012 | Grannen et al. | |
| 2014/0354110 A1 | 12/2014 | Araki et al. | |
| 2015/0082901 A1 | 3/2015 | Fuji et al. | |

FOREIGN PATENT DOCUMENTS

| | | | |
|---|---|---|---|
| JP | 2004-312657 A | 11/2004 | |
| JP | 2005-079993 * | 2/2005 | H01L 41/09 |
| JP | 2005-079993 * | 3/2005 | H01L 41/09 |
| JP | 2005-79993 A | 3/2005 | |
| JP | 2005-210004 A | 8/2005 | |
| JP | 2007-208727 A | 8/2007 | |
| JP | 2015-61070 A | 3/2015 | |
| KR | 10-2004-0084478 A | 10/2004 | |
| KR | 10-2012-0023285 A | 3/2012 | |
| WO | WO 2013/125371 A1 | 8/2013 | |

OTHER PUBLICATIONS

Chinese Office Action dated Sep. 4, 2019 in corresponding Chinese Patent Application No. 201610256399.9 (13 pages in English, 8 pages in Chinese).

Korean Office Action dated Nov. 7, 2019 in counterpart Korean Patent Application No. 10-2015-0181490 (12 pages, in Korean with English translation).

* cited by examiner

ACOUSTIC RESONATOR AND METHOD OF MANUFACTURING THE SAME

CROSS-REFERENCE TO RELATED APPLICATION

This application claims the benefit under 35 USC 119(a) of Korean Patent Application No. 10-2015-0181490 filed on Dec. 18, 2015 in the Korean Intellectual Property Office, the entire disclosure of which is incorporated herein by reference for all purposes.

BACKGROUND

1. Field

The following description relates to an acoustic resonator and a method of manufacturing the same.

2. Description of Related Art

With the recent trend to miniaturize wireless communications devices, efforts have been made to also reduce radio frequency components that are used in the wireless communications devices. Film bulk acoustic resonators (FBAR) manufactured using semiconductor thin film wafer technology are an example thereof.

A film bulk acoustic resonator refers to a resonator implemented with a thin film element that resonates. The thin film element is generally obtained by depositing a piezoelectric dielectric material on a semiconductor substrate, such as a silicon wafer, in order to utilize the piezoelectric characteristics of a piezoelectric dielectric material.

Film bulk acoustic resonators have a wide range of application. For example, film bulk acoustic resonators are used as small and light weight filters for devices such as mobile communications devices, chemical and biological devices, and the like, and as an oscillator, a resonance element, an acoustic resonance mass sensor, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a resonating part including a first electrode, a second electrode, and a piezoelectric layer disposed between the first electrode and the second electrode, and a plurality of seed layers disposed on one side of the resonating part.

The general aspect of the acoustic resonator may further include a substrate disposed on the opposite side of the resonating part from the plurality of seed layers.

An air gap may be disposed between the substrate and the plurality of seed layers.

The resonating part may further include a protection layer.

A membrane may be interposed between the substrate and the plurality of seed layers, and an air gap may be disposed between the substrate and the membrane.

The membrane may include a plurality of membrane layers, and at least one membrane layer of the plurality of membrane layers may be an etching stopper.

The plurality of seed layers may include a first seed layer and a second seed layer. The first seed layer may include a material having the same crystalline system as a material of the piezoelectric layer. The second seed layer may include a material having the same unit cell geometry as a material of the first seed layer.

A thickness of the first seed layer or the second seed layer may be within a range of 10 Å to 1,000 Å.

The piezoelectric layer, the first seed layer, and the second seed layer may each include a material having a hexagonal crystal system.

The piezoelectric layer may include aluminum nitride or doped aluminum nitride. The first electrode may include molybdenum. The first seed layer may include aluminum nitride. The second seed layer may include titanium.

An upper surface of the first seed layer may correspond to a (002) plane of hexagonal crystal lattice.

In another general aspect, a method of manufacturing an acoustic resonator includes forming a sacrificial layer on a substrate, forming a plurality of seed layers on the substrate or the sacrificial layer, forming a first electrode on the plurality of seed layers, forming a piezoelectric layer on the first electrode, and forming a second electrode on the piezoelectric layer.

The general aspect of the method may further include, before the forming of the plurality of seed layers, forming a membrane on the substrate or the sacrificial layer.

In the forming of the plurality of seed layers, at least one seed layer of the plurality of seed layers may be grown in only a stacking direction.

The general aspect of the method may further include forming a protection layer on the second electrode and the piezoelectric layer.

The general aspect of the method may further include forming an air gap by removing the sacrificial layer.

In another general aspect, a method of manufacturing an acoustic resonator involves depositing a first electrode on a plurality of seed layers, and depositing a piezoelectric layer on the first electrode, in which the plurality of seed layers includes a first seed layer and a second seed layer, and the first seed layer and the second seed layer include materials having a same unit cell geometry.

The plurality of seed layers may be obtained by depositing the first seed layer on the second seed layer.

The first seed layer may be deposited on a hexagonal (002) plane of a material forming the second seed layer.

The first seed layer or the second seed layer may include a material that belongs to the same crystalline system as a material forming the piezoelectric layer.

The first seed layer may be grown without a polycrystalline growth region on the first seed layer.

An upper surface of the second seed layer may correspond to a (002) plane of titanium or a (002) plane of aluminum nitride.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
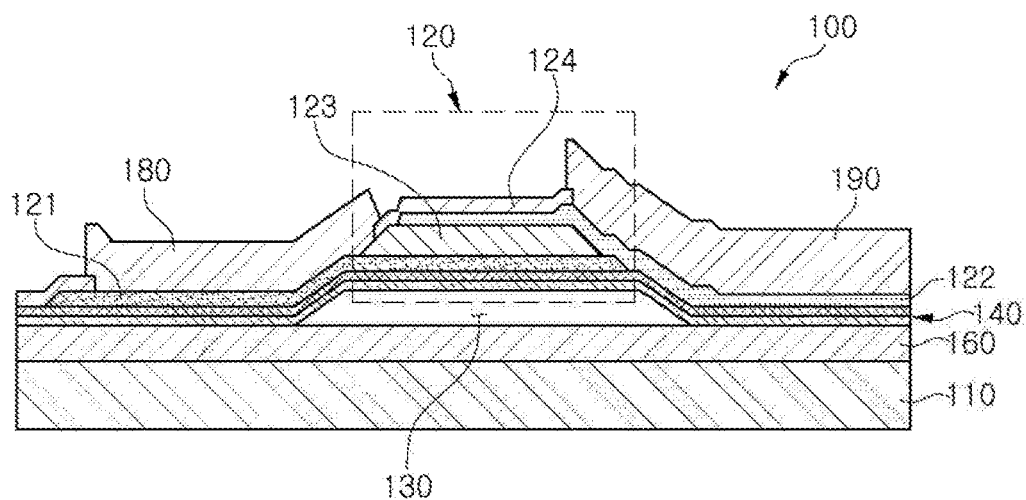
FIG. 1 is a cross-sectional view of an example of an acoustic resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

As noted above, acoustic resonators have a wide range of application. However, various structural shapes and functions for increasing characteristics and performances of acoustic resonators, such as a film bulk acoustic resonators (FBAR), are being researched. For example, a demand exists for modifications to the structure, the material or the manufacturing method of producing film bulk acoustic resonators that may secure various frequencies and bands.

In order to increase a data transfer amount and a data transfer rate, an acoustic resonator such as a film bulk acoustic resonator (FBAR), for example, may need to have a wide bandwidth.

In order to secure the wide bandwidth as described above, an electro-mechanical coupling coefficient (kt2) value of the acoustic resonator may need to be increased.

However, because the kt2 value of the acoustic resonator typically exists in a trade-off relationship with a quality factor (QF), a technology that can increase the kt2 value without sacrificing the quality factor is demanded.

As a method of improving the kt2 value, a method of increasing crystallinity of a piezoelectric layer itself has been researched.

According to an aspect of the present description, an acoustic resonator capable of increasing the overall performance by increasing crystallinity of a piezoelectric material is suggested. According to another aspect, in order to improve the kt2 value by securing crystallinity of the piezoelectric layer, a method in which a plurality of seed layers are added to bottoms of electrodes is suggested.

According to an aspect, an acoustic resonator may include: a resonating part including a first electrode, a second electrode, and a piezoelectric layer disposed between the first electrode and the second electrode; and a plurality of seed layers disposed on one side of the resonating part, whereby crystallinity of the piezoelectric layer may be secured and an electro-mechanical coupling coefficient (kt2) value of the acoustic resonator may be improved.

Figure 2:
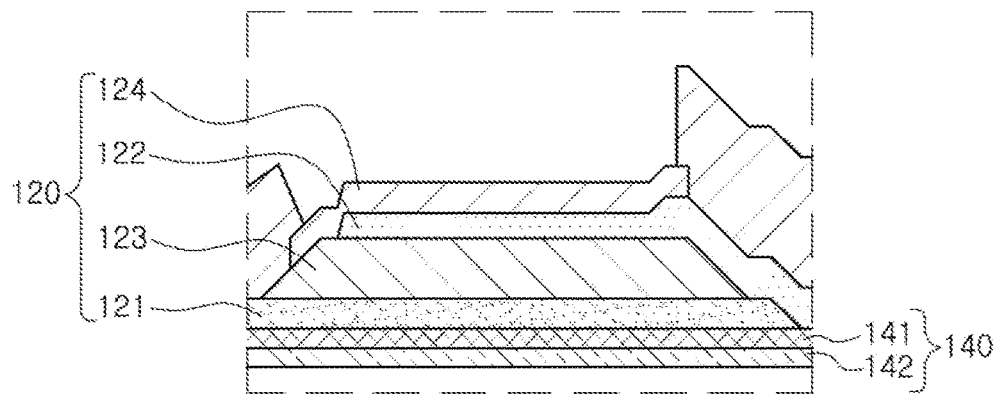
FIG. 2 is an enlarged cross-sectional view illustrating an example of a resonating portion of an acoustic resonator illustrated in FIG. 1.

According to another aspect, a method of manufacturing an acoustic resonator may include: forming a sacrificial layer on a substrate; forming a plurality of seed layers on the substrate or the sacrificial layer; forming a first electrode on the plurality of seed layers; forming a piezoelectric layer on the first electrode; and forming a second electrode on the piezoelectric layer, whereby an acoustic resonator having a high kt2 value may be provided by a simple process FIG. 1 illustrates a cross-sectional view of an example of an acoustic resonator, and FIG. 2 illustrates an enlarged cross-sectional view illustrating an example of a resonating portion of the acoustic resonator illustrated in FIG. 1.

Referring to FIGS. 1 and 2, an acoustic resonator 100 includes a resonating part 120 including a first electrode 121, a second electrode 122, and a piezoelectric layer 123 disposed between the first electrode and the second electrode; and a plurality of seed layers 140 disposed on one side of the resonating part 120.

Further, the acoustic resonator 100 includes a substrate 110 disposed on an opposite side of the plurality of seed layers 140 from the resonating part 120.

The substrate 110 may be formed in a silicon substrate or a silicon on insulator (SOI) type substrate.

In this example, an air gap 130 is formed between the substrate 110 and the plurality of seed layers 140, and at least a portion of the plurality of seed layers is disposed to be spaced apart from the substrate 110 by the air gap 130.

By forming the air gap 130 between the plurality of seed layers 140 and the substrate 110, an acoustic wave generated from the piezoelectric layer 123 may not be affected by the substrate.

Further, the reflective characteristics of the acoustic wave generated from the resonating part 120 may be improved by the air gap 130.

Because the air gap 130, which is an empty space, has an impedance that is close to infinity, the acoustic wave may remain in the resonating part 120 while not being lost by the air gap.

Therefore, the loss of the acoustic wave in a longitudinal direction may be significantly reduced by the air gap 130. As a result, a quality factor (QF) of the resonating part 120 may be improved.

The resonating part 120 includes the first electrode 121, the second electrode 122, and the piezoelectric layer 123 as described above. The resonating part 120 may be formed by sequentially laminating the first electrode 121, the piezoelectric layer 123, the second electrode 122 from below.

When the layers are formed in this order, the piezoelectric layer 123 is disposed between the first electrode 121 and the second electrode 122.

The resonating part 120 may make the piezoelectric layer 123 resonate in response to electrical signals applied to the first electrode 121 and the second electrode 122 to generate a resonance frequency and an anti-resonance frequency.

The first electrode 121 and the second electrode 122 may be formed of a metal such as gold, molybdenum, ruthenium, aluminum, platinum, titanium, tungsten, palladium, chrome, nickel, iridium, or the like.

The resonating part 120 may use the acoustic wave of the piezoelectric layer 123. For example, in response to signals being applied to the first electrode 121 and the second electrode 122, mechanical vibration may occur in a thickness direction of the piezoelectric layer 123 to generate the acoustic wave.

The piezoelectric layer 123 may be formed of a piezoelectric material such as zinc oxide (ZnO), aluminum nitride (AlN), silicon dioxide ($SiO_2$), doped zinc oxide (e.g., W—ZnO), doped aluminum nitride (e.g., Sc—AlN, MgZr—AlN, Cr—AlN, Er—AlN, Y—AlN), or the like.

A resonance phenomenon of the piezoelectric layer 123 may occur in response to a half of a wavelength of the applied signal matching a thickness of the piezoelectric layer.

Because the electrical impedance sharply changes in response to the occurrence of resonance phenomenon, the acoustic resonator according to this embodiment may be used as a filter capable of selecting a frequency.

The resonance frequency may be determined by the thickness of the piezoelectric layer 123, the inherent acoustic wave velocity of the piezoelectric layer 123, the first electrode 121 and the second electrode 122 that surround the piezoelectric layer 123, and the like.

In general, in response to the thickness of the piezoelectric layer 123 being reduced, the resonance frequency is increased.

Further, because the piezoelectric layer 123 is disposed only in the resonating part 120, a phenomenon in which the acoustic wave generated by the piezoelectric layer is leaked externally from the resonating part may be significantly reduced.

In this example, the resonating part 120 further includes a protection layer 124.

The protection layer 124 covers the second electrode 122 to prevent the second electrode 122 from being exposed to an external environment. However, the present description is not limited thereto.

In this example, the first electrode 121 and the second electrode 122 extend to an outer side of the piezoelectric layer 123, and a first connection part 180 and a second connection part 190 are each connected to the extended portion.

The first connection part 180 and the second connection part 190 may be provided to confirm characteristics of the resonator and the filter and perform a required frequency trimming, but are not limited thereto.

The plurality of seed layers 140 are disposed on one side of the resonating part 120, that is, below the first electrode 121.

The plurality of seed layers 140 includes a first seed layer 141 and a second seed layer 142, and the first seed layer and the second seed layer may be obtained by being sputtered on a planarized substrate 110 or a sacrificial layer (not illustrated).

The first seed layer 141 may be manufactured using aluminum nitride (AlN), doped aluminum nitride (e.g., Sc—AlN, MgZr—AlN, Cr—AlN, Er—AlN, Y—AlN), or other similar crystalline materials, such as aluminum oxynitride (AlON), silicon dioxide ($SiO_2$), silicon nitride ($Si_3N_4$), silicon carbide (SiC), and the like.

In an example, the first seed layer 141 is formed of aluminum nitride (AlN). The second seed layer 142 is formed of a material having the same crystalline system or Bravais lattice system as the material forming the first seed layer 141. For example, aluminum nitride (AlN) has a hexagonal crystal system. Thus, in the event that the first seed layer 141 is formed of aluminum nitride (AlN), the second seed layer 142 may be formed of a metal of a hexagonal system having unit cells of the same geometry, such as magnesium (Mg), titanium (Ti), zinc (Zn), and the like.

FIGS. 1 and 2 illustrate an example in which the first seed layer 141 is stacked on the second seed layer 142, but the order of stacking the first and second seed layers is not limited thereto. On the contrary, the second seed layer may be stacked on the first seed layer.

In this example, at least one of the seed layers is formed of a piezoelectric material so as not to serve as an electrode and rather to serve as a piezoelectric layer, thereby affecting the piezoelectric characteristics of the piezoelectric layer 123.

As a result, in the event that a film thickness of the seed layers becomes too thick, an influence on piezoelectric characteristics of the piezoelectric layer may be increased. Thus, according to one example, a thickness of the first seed layer 141 may be set within a range of about 10 Å to 1,000 Å so that the influence on piezoelectric characteristics is not increased more than necessary.

Further, the second seed layer 142 formed of a metal that belongs to the hexagonal crystal system or having the same crystal lattice structure such as titanium, or the like, may need to be grown in only a (001) direction, that is, a stacking direction. However, if a thickness of the second seed layer 142 is grown to be 1,000 Å or more, the second seed layer 142 may also be grown in a (010) direction in addition to a (001) direction, thereby increasing a lattice mismatch with the first seed layer 141.

Eventually, because a growth in a (010) direction causes deterioration in crystallinity of the first electrode 121 and the piezoelectric layer 123 grown on the second seed layer 142, according to one example, the thickness of the second seed layer 142 is also set to 1,000 Å or less in which the second seed layer 142 is grown in only a (001) direction, that is, the stacking direction.

In order to increase the crystallinity of the piezoelectric layer 123, the crystallinity of the first electrode 121 disposed below the piezoelectric layer 123 may need to be secured. To this end, according to one example, a plurality of seed layers 140 is used below the first electrode.

For example, in the event that a piezoelectric layer 123 is formed of aluminum nitride (AlN) and the first electrode 121 is formed of molybdenum, a thin film of the piezoelectric layer formed of aluminum nitride may initially show polycrystalline growth characteristics, and may then be aligned in a (001) direction in which the growth speed is the fastest.

In the event that the first electrode 121 formed of molybdenum is grown without using any seed layers, the crystallinity of the piezoelectric layer 123 formed of aluminum nitride that is deposited on the first electrode 121 may also deteriorate due to the defects in the crystalline structure of the molybdenum first electrode 121.

However, in an example, by utilizing a first seed layer 141 formed of aluminum nitride, an aluminum nitride seed starts to grow in a (001) direction, that is, the stacking direction, there by securing a higher crystallinity of the first electrode 121 formed of molybdenum, and a higher crystallinity of the piezoelectric layer 123 formed of aluminum nitride disposed on the first electrode 121.

As such, in this example, the piezoelectric layer 123 exhibits excellent crystallinity, and the kt2 value of the acoustic resonator 100 is increased.

Meanwhile, because aluminum nitride (002) and molybdenum (110) have a very large lattice mismatch of 12.45%, a method of increasing piezoelectric characteristics by increasing the thickness of the piezoelectric layer formed of aluminum nitride may be applied; however, due to a size limit imposed on the acoustic resonators, there exists a limit in increasing the piezoelectric characteristics by using the method of increasing the thickness of the piezoelectric layer until the polycrystalline growth gradually shifts to a single-crystal growth.

However, because a lattice mismatch between molybdenum (110) and titanium (002) is only 7.64%, an excellent crystallinity may be secured for a molybdenum layer by juxtaposing a titanium seed layer.

In an example, a molybdenum layer may be aligned in a (110) crystalline plane direction. An excellent crystallinity for an aluminum nitride layer may be obtained by forming the aluminum nitride layer on a molybdenum layer exposing the (110) plane.

According to an X-ray diffraction test, it may be seen that when titanium is grown in only a (001) direction, that is, the stacking direction, and molybdenum and aluminum nitride are deposited on titanium, aluminum nitride is grown in only a (001) direction and molybdenum is grown in only a (110) direction, similar to when molybdenum and aluminum nitride are deposited on the aluminum nitride seed, thereby securing improved crystallinity of the piezoelectric layer as compared to the case in which only the aluminum nitride seed is used.

Further, it may be seen that the lattice mismatch between aluminum nitride (002) and titanium (002), which is 5.49%, is lower than the lattice mismatch between molybdenum (110) and titanium (002), which is 7.64%.

Further, it may be seen that because aluminum nitride and titanium have the same hexagonal system, excellent crystallinity may be secured when two materials are stacked on each other.

Therefore, according to an example, in order to improve the kt2 value by securing crystallinity of the piezoelectric layer 123, the second seed layer 142 formed of, for example, titanium, or the like, having a low lattice mismatch, that is, the plurality of seed layers, may be disposed below the first seed layer 141 formed of, for example, aluminum nitride, or the like.

According to one example, a second seed layer 142 formed of titanium having the low lattice mismatch is employed below the first seed layer 141 formed of aluminum nitride. Because titanium is grown in a (001) direction, that is, the stacking direction, and titanium (002) and aluminum nitride (002) have the low lattice mismatch, the first seed layer formed of aluminum nitride may be directly grown in a (001) direction, that is, the stacking direction without an initial polycrystalline growth.

As a result, high crystallinity of the first seed layer 141 formed of aluminum nitride (002) may be secured, and crystallinity of the first electrode 121 formed of molybdenum (110) and the piezoelectric layer 123 formed of aluminum nitride (002) grown on the first seed layer 141 may be improved. As a result, a high kt2 value may be obtained without increasing loss in the acoustic wave.

Figure 6:
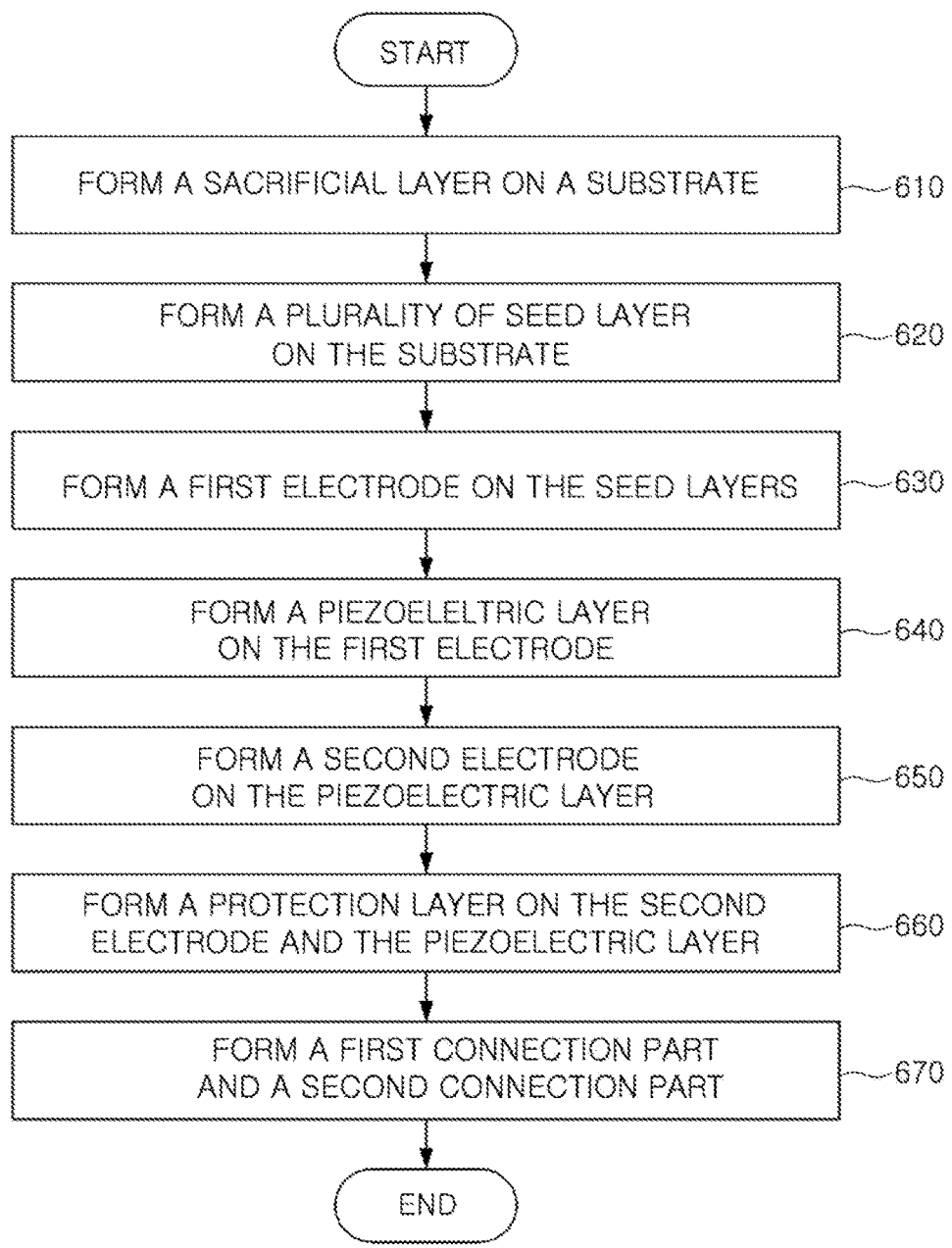
FIG. 6 is a flowchart illustrating an example of a method of manufacturing an acoustic resonator.

FIG. 6 illustrates an example of a method of manufacturing an acoustic resonator.

First, a sacrificial layer is formed on a substrate 110 in 610. As a material for the sacrificial layer, silicon dioxide, polysilicon, polymer, or the like may be used.

The sacrificial layer may be removed later by an etching process to form an air gap 130. The shape of the sacrificial layer may conform to the shape of the air gap 130 to be formed later.

Next, a plurality of seed layers 140 may be sequentially formed on the substrate 110 and the sacrificial layer in 620. A technology and a process of manufacturing the seed layers widely known in the art, such as a sputtering technology, may be used to manufacture the seed layers.

By properly controlling process conditions of the sputtering that is performed such as, for example, a temperature, the degree of a vacuum, strength of power, an amount of injected gas, and the like, the plurality of seed layers 140 may be grown in only a (001) direction, that is, the stacking direction.

As such, in an example in which most of the plurality of seed layers are oriented in a desired direction, that is, a (001) direction, when the piezoelectric layer 123 is formed on the plurality of seed layers 140 as described below, the piezoelectric layer may succeed a crystal structure of the seed layers 140 to be oriented in the same crystal structure as the seed layers 140.

According to one example, the first seed layer 141 may be formed of aluminum nitride (AlN), but is not limited thereto. For example, various materials such as silicon dioxide ($SiO_2$), silicon nitride ($Si_3N_4$), silicon carbide (SiC), aluminum oxynitride (AlON), and the like may be used.

Further, the second seed layer 142 may be formed of titanium (Ti), but is not limited thereto. For example, a metal such as magnesium, zinc, or the like may be used.

In an example of a filter that includes a plurality of resonators, a second seed layer 142 may need to be selectively formed in only the predetermined resonator that requires a high kt2 value. Thus, the second seed layer 142 may be left on only a predetermined portion of the filter by performing a patterning after forming the second seed layer using titanium by the sputtering, and the following processes may be performed.

According to an example, the second seed layer 142 may be formed of a material having a hexagonal close packed structure such as titanium (Ti), magnesium (Mg), zinc (Zn), or the like, before the first seed layer 141. For example, a titanium seed layer having a thickness of 10 to 1000 Å may be formed directly on a Si substrate. The crystal orientation of the second seed layer comprised of titanium deposited by a sputtering method may be controlled in order to expose substantially a (002) plane of its hexagonal lattice. When the thickness of the titanium seed layer exceeds 1000 Å, the growth along a (010) plane of the lattice increases, thereby increasing dislocation.

On an upper surface corresponding to a (002) plane of titanium layer, the first seed layer 141 may be grown. The first seed layer 141 may be an aluminum nitride (AlN) layer, but the present description is not limited thereto. For example, various materials such as silicon dioxide ($SiO_2$), silicon nitride ($Si_3N_4$), silicon carbide (SiC), aluminum oxynitride (AlON), and the like may be used.

A first seed layer 141 comprised of aluminum nitride (AlN) may be grown with high crystallinity on a (002) plane of a titanium layer because the lattice mismatch is low. The aluminum nitride (AlN) seed layer may be deposited by a sputtering method to expose a (002) plane of its hexagonal lattice. By forming the second seed layer 141 of titanium (002) prior to forming the first seed layer 141 of aluminum nitride (002), it is possible to prevent an initial polycrystalline growth of aluminum nitride on a silicon substrate. Accordingly, the plurality of seed layers 140 makes it possible to secure high crystallinity for subsequent layers deposited thereon.

Thereafter, the first electrode 121 and the piezoelectric layer 123 are sequentially formed on the plurality of seed layers 140.

In 630, the first electrode 121 is formed. The first electrode 121 may be formed by depositing a conductive layer on the seed layers 140. Similarly, in 640, the piezoelectric layer 123 may be formed by depositing a piezoelectric material on the first electrode 121.

In the illustrated embodiment, the first electrode 121 may be formed of a molybdenum (Mo) material, but is not limited thereto. For example, various metals such as gold, ruthenium, aluminum, platinum, titanium, tungsten, palladium, chrome, nickel, iridium, and the like may be used.

According to one example, a first electrode 121 composed of molybdenum (Mo) is deposited on a (002) plane of a first seed layer 141 formed of aluminum nitride (AlN), the first seed layer 141 deposited on a (002) plane of a second seed layer 142 formed of titanium (Ti), For instance, the first electrode 121 of molybdenum (110) may be grown on a first seed layer 142 formed of a (002) oriented aluminum nitride layer.

Further, the piezoelectric layer 123 may be formed of aluminum nitride (AlN), but is not limited thereto. For example, various piezoelectric materials such as zinc oxide (ZnO), silicon dioxide ($SiO_2$), doped zinc oxide (e.g., W—ZnO), doped aluminum nitride (e.g., Sc—AlN, MgZr—AlN, Cr—AlN, Er—AlN, Y—AlN), and the like may be used.

According to one example, a piezoelectric layer 123 formed of aluminum nitride (AlN) may be formed on a first electrode 121 of Mo (110) formed on a first seed layer 141 of AlN (002) and a second seed layer 142 of Ti (002). A high crystallinity piezoelectric layer 123 may be obtained by controlling the crystalline orientation at the interface between the first seed layer 141 and the second seed layer 142, the first seed layer 141 and the first electrode 121, and the first electrode 121 and the piezoelectric layer 123.

The first electrode 121 and the piezoelectric layer 123 may be formed in a predetermined pattern by depositing a photoresist on the conductive layer or the piezoelectric layer, performing the patterning using a photolithography process, and then removing unnecessary portions using the patterned photoresist as a mask.

Thereby, the piezoelectric layer 123 may be left on only the first electrode 121. As a result, the first electrode may be left to further protrude around the piezoelectric layer.

Next, the second electrode 122 is formed in 650.

The second electrode 122 may be formed in a predetermined pattern by forming the conductive layer on the piezoelectric layer 123 and the first electrode 121, depositing the photoresist on the conductive layer, performing the patterning using the photolithography process, and then removing unnecessary portions using the patterned photoresist as the mask.

According to one example, the second electrode 122 may be formed of ruthenium (Ru), but is not limited thereto. For example, various metals such as gold, molybdenum, aluminum, platinum, titanium, tungsten, palladium, chrome, nickel, iridium, and the like may be used.

Next, the protection layer 124 is formed on the second electrode 122 and the piezoelectric layer 123 in 660.

The protection layer 124 may be formed of an insulating material. Examples of the insulating material include silicon oxide based materials, silicon nitride based materials, and aluminum nitride based materials.

Thereafter, the connection parts 180 and 190 are formed in 670. The connection parts 180 and 190 may be used for a frequency trimming.

The first connection part 180 and the second connection part 190 may penetrate through the protection layer 124 to be bonded to the first electrode 121 and the second electrode 122, respectively.

The first connection part 180 may be formed by partially removing the protection layer 124 by the etching to form a hole, externally exposing the first electrode 121, and then depositing gold (Au), copper (Cu), or the like on the first electrode.

Similarly, the second connection part 190 may also be formed by partially removing the protection layer 124 by the etching to form the hole, externally exposing the second electrode 122, and then depositing gold (Au), copper (Cu), or the like on the second electrode.

After confirming characteristics of the resonating part 120 or the filter and performing a frequency trimming as desirable using the connection parts 180 and 190, the air gap 130 may be formed.

The air gap 130 may be formed by removing the sacrificial layer as described above. As a result, the resonating part 120 may be completed.

Here, the sacrificial layer may be removed by a dry etching, but is not limited thereto.

For example, the sacrificial layer may be formed of polysilicon. Such a sacrificial layer may be removed by dry etching gas such as xenon difluoride ($XeF_2$).

Meanwhile, the acoustic resonator and the method of manufacturing the same according to the present disclosure are not limited to the above-mentioned embodiments, and may be variously modified.

Figure 3:
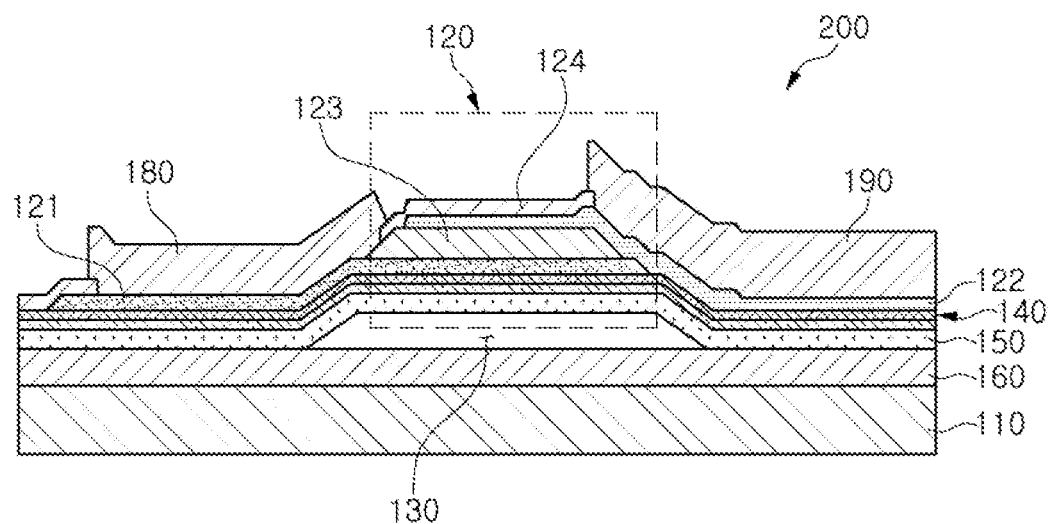
FIG. 3 is a cross-sectional view of another example of an acoustic resonator.
Figure 4:
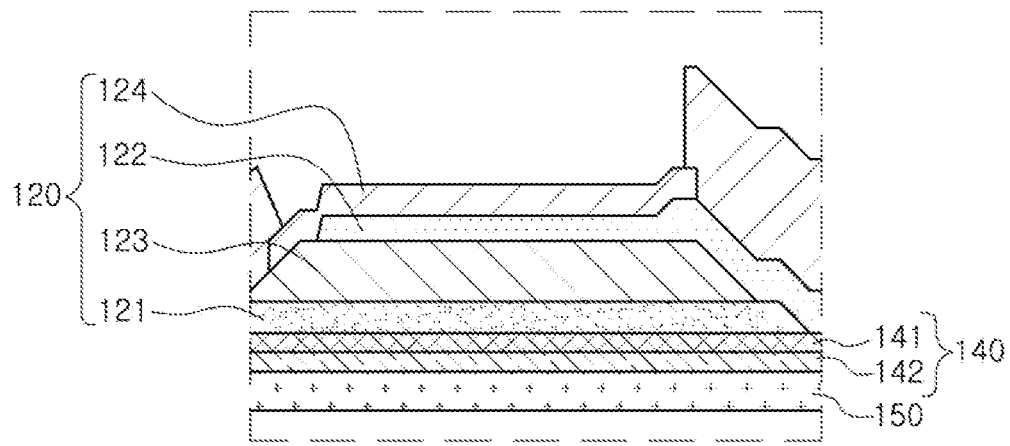
FIG. 4 is an enlarged cross-sectional view illustrating an example of a resonating portion of an acoustic resonator illustrated in FIG. 3.

FIG. 3 illustrates a cross-sectional view of another example of an acoustic resonator, and FIG. 4 illustrates an enlarged cross-sectional view of a main part of the acoustic resonator illustrated in FIG. 3.

Referring to FIGS. 3 and 4, an acoustic resonator 200 includes a resonating part 120 including a first electrode 121, a second electrode 122, and a piezoelectric layer 123 disposed between the first electrode and the second electrode; a plurality of seed layers 140 disposed on one side of the resonating part; and a membrane 150 disposed on the opposite side of the resonating part from the seed layers.

The remaining components of the acoustic resonator illustrated in FIG. 3 are the same as those described above with reference to FIGS. 1 and 2, except that the membrane 150 is disposed below the plurality of seed layers 140.

Thus, in describing the acoustic resonator 200 according to another example, the same components as those of the acoustic resonator 100 are denoted by like reference numerals.

Referring to FIGS. 3 and 4, the acoustic resonator 200 further includes the substrate 110 disposed on an opposite side of the plurality of seed layers 140 from the resonating part 120. In addition, the membrane 150 is interposed between the plurality of seed layers 140 and the substrate 110.

The substrate 110 may be formed in a silicon substrate or a silicon on insulator (SOI) type substrate.

The air gap 130 is formed between the substrate 110 and the membrane 150, and at least a portion of the membrane may be disposed to be spaced apart from the substrate by the air gap.

Further, because the resonating part 120 is formed on the membrane 150, the resonating part may also be spaced apart from the substrate 110 by the air gap 130.

By forming the air gap 130 between the substrate 110 and the membrane 150, an acoustic wave generated from the piezoelectric layer 123 may not be affected by the substrate.

Further, reflective characteristics of the acoustic wave generated from the resonating part 120 may be improved by the air gap 130.

Because the air gap 130, which is an empty space, has impedance that is close to infinity, the acoustic wave may remain in the resonating part 120 while not being lost by the air gap 130.

Therefore, loss of the acoustic wave in a longitudinal direction may be significantly reduced by the air gap 130. As a result, a quality factor (QF) of the resonating part 120 may be improved.

In this example, the membrane 150 is positioned on the air gap 130 to maintain a shape of the air gap 130 and to provide structural support to the resonating part 120.

The membrane 150 may be formed of silicon dioxide ($SiO_2$), or the like.

As described below, in an example in which the air gap 130 is formed by etching the sacrificial layer, the membrane may be formed of a plurality of membrane layers so that the membrane 150 may serve as an etching stopper.

Figure 5:
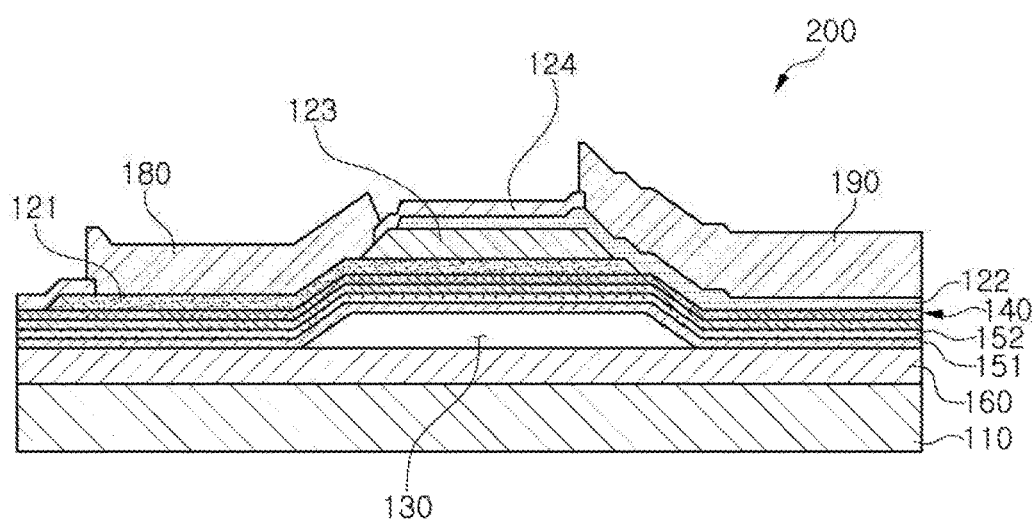
FIG. 5 is an enlarged cross-sectional view illustrating another example of an acoustic resonator.

For example, referring to FIG. 5, the membrane 150 includes a first membrane layer 151 formed of, for example, silicon dioxide ($SiO_2$), and a second membrane layer 152 formed of, for example, silicon nitride ($SiN_x$) and formed on the first membrane layer.

Of course, a stop layer 160 serving as the etching stopper may also be formed on the substrate to protect the substrate 110, and the stop layer may include silicon oxide ($SiO_x$), silicon nitride ($SiN_x$), or the like.

The resonating part 120 includes the first electrode 121, the piezoelectric layer 123, and the second electrode 122, as described above, and the resonating part 120 may be obtained by sequentially laminating the first electrode, the piezoelectric layer, and the second electrode from below.

The resonating part 120 may make the piezoelectric layer 123 resonate in response to electrical signals applied to the first electrode 121 and the second electrode 122 to generate a resonance frequency and an anti-resonance frequency.

The first electrode 121 and the second electrode 122 may be formed of a metal such as gold, molybdenum, ruthenium, aluminum, platinum, titanium, tungsten, palladium, chrome, nickel, iridium, or the like.

The resonating part 120 may use the acoustic wave of the piezoelectric layer 123. For example, in response to signals being applied to the first electrode 121 and the second electrode 122, mechanical vibration may occur in a thickness direction of the piezoelectric layer 123 to generate the acoustic wave.

The piezoelectric layer 123 may be formed of a piezoelectric material such as zinc oxide (ZnO), aluminum nitride (AlN), silicon dioxide ($SiO_2$), doped zinc oxide (e.g., W—ZnO), doped aluminum nitride (e.g., Sc—AlN, MgZr—AlN, Cr—AlN, Er—AlN, Y—AlN), or the like.

In the illustrated example, the resonating part 120 further includes the protection layer 124.

The protection layer 124 covers the second electrode 122 to prevent the second electrode from being exposed to an external environment.

The first electrode 121 and the second electrode 122 extend to an outer side of the piezoelectric layer 123, and the first connection part 180 and the second connection part 190 are each connected to the extended portion.

The first connection part 180 and the second connection part 190 may be provided to confirm characteristics of the resonator and the filter and to perform a required frequency trimming, but are not limited thereto.

The plurality of seed layers 140 are disposed between the resonating part 120 and the membrane 150, that is, below the first electrode 121 and on the membrane 150.

The plurality of seed layers 140 includes the first seed layer 141 and the second seed layer 142, and the first seed layer and the second seed layer may be deposited by being sputtered on a planarized substrate 110 or a sacrificial layer (not illustrated).

The first seed layer 141 may be manufactured using aluminum nitride (AlN), doped aluminum nitride (e.g., Sc—AlN, MgZr—AlN, Cr—AlN, Er—AlN, Y—AlN), or other similar crystalline materials, such as aluminum oxynitride (AlON), silicon dioxide ($SiO_2$), silicon nitride ($Si_3N_4$), silicon carbide (SiC), and the like.

In an example, the first seed layer is formed of aluminum nitride (AlN), and the second seed layer 142 is formed of a material having the same crystalline lattice structure with the first seed layer 141. For example, the second seed layer 142 may be formed of a metal of a hexagonal lattice system having the same unit cell geometry, such as magnesium (Mg), titanium (Ti), zinc (Zn), and the like.

FIGS. 3 through 5 illustrate examples of acoustic resonators in which the first seed layer 141 is stacked on the second seed layer 142, but the order of stacking the first and second seed layers is not limited thereto. On the contrary, the second seed layer may be stacked on the first seed layer.

In these examples, at least one of the seed layers 140 is formed of a piezoelectric material so as not to serve as an electrode and rather to serve as a piezoelectric layer, thereby affecting the piezoelectric characteristics of the piezoelectric layer 123.

In the event that a film thickness of the seed layers becomes too thick, an influence on piezoelectric characteristics of the piezoelectric layer 123 may be increased. Thus, according to these examples, a thickness of the first seed layer 141 is set within the range of about 10 Å to 1,000 Å so that the influence on piezoelectric characteristics is not increased more than desirable.

Further, the second seed layer 142 formed of the metal of the hexagonal system such as titanium, or the like, may need to be grown in only a (001) direction, that is, a stacking direction. However, in the event that a thickness of the second seed layer 142 is grown to be 1,000 Å or more, the second seed layer 142 may also be grown in a (010) direction in addition to a (001) direction, thereby increasing a lattice mismatch with the first seed layer 141.

Because growing a thick layer eventually causes a deterioration in the crystallinity of the first electrode 121 and the piezoelectric layer 123 grown on the second seed layer 142, according to one example, the thickness of the second seed layer 142 is set to be 1,000 Å or less such that the second seed layer 142 is grown in only a (001) direction, that is, the stacking direction.

In order to increase the crystallinity of the piezoelectric layer 123, the crystallinity of the first electrode 121 disposed below the piezoelectric layer 123 may need to be secured. To this end, according to one example, the plurality of seed layers 140 are used below the first electrode.

In this example, in order to improve the kt2 value by securing the crystallinity of the piezoelectric layer 123, the second seed layer 142 formed of, for example, titanium, or the like, having a low lattice mismatch, that is, the plurality of seed layers, may be disposed below the first seed layer formed of, for example, aluminum nitride, or the like.

According to one example, a second seed layer 142 formed of titanium is employed below a first seed layer 141 formed of aluminum nitride. Because titanium is grown in a (001) direction, that is, the stacking direction, and titanium and aluminum nitride have a low lattice mismatch, the first seed layer formed of aluminum nitride may be directly grown in a (001) direction, that is, the stacking direction without an initial polycrystalline growth.

As a result, a high crystallinity is secured for the first seed layer 141 formed of aluminum nitride, and the crystallinity of the first electrode 121 formed of molybdenum and the piezoelectric layer 123 formed of aluminum nitride grown on the first seed layer 141 is improved. Thus, a high kt2 value may be obtained without increasing loss in the acoustic wave.

Hereinafter, another example of a method of manufacturing an acoustic resonator will be described.

First, a sacrificial layer (not illustrated) may be formed on the substrate 110, as in 610 of FIG. 6. As a material for the sacrificial layer, silicon dioxide, polysilicon, polymer, or the like may be used.

The sacrificial layer may be removed later by an etching process to form the air gap 130.

Next, a membrane 150 may be formed on the substrate 110. The membrane 150 may be deposited on the substrate 110 and the sacrificial layer.

As a method of forming the membrane 150, a proper method may be selected and used among deposition methods such as a chemical vapor deposition (CVD) method, a sputtering method, and the like, depending on a material that forms the membrane 150.

Further, according to one example, as the membrane, a first membrane layer 151 formed of, for example, silicon dioxide ($SiO_2$) may be formed, and a second membrane layer 152 formed of, for example, silicon nitride ($SiN_x$) may be formed on the first membrane layer.

In addition, a plurality of seed layers 140 may be sequentially formed on the membrane 150. A technology or process of manufacturing the seed layers widely known in the art, such as a sputtering technology, may be used to manufacture the seed layers.

According to one example, by properly controlling the process conditions of the sputtering, such as a temperature, the degree of a vacuum, strength of power, an amount of injected gas, and the like, the plurality of the seed layers 140 may be grown in only a (001) direction, that is, the stacking direction.

As such, in an example in which most of the plurality of seed layers are oriented in a desired direction, that is, a (001) direction, when the piezoelectric layer 123 is formed on the plurality of seed layers 140 as described below, the piezoelectric layer may succeed a crystal structure of the seed layers 140 to be oriented in the same crystal structure and orientation as the seed layers 140.

According to one example, the first seed layer 141 may be formed of aluminum nitride (AlN), but is not limited thereto. For example, various materials such as silicon dioxide ($SiO_2$), silicon nitride ($Si_3N_4$), silicon carbide (SiC), aluminum oxynitride (AlON), and the like may be used.

Further, according to another example, the second seed layer 142 may be formed of titanium (Ti), but is not limited thereto. For example, a metal such as magnesium (Mg), zinc (Zn), or the like may be used.

Thereafter, the first electrode 121 and the piezoelectric layer 123 may be sequentially formed on a plurality of seed layers 140.

The first electrode 121 may be formed by depositing a conductive layer on the seed layers 140. Similarly, the piezoelectric layer 123 may be formed by depositing a piezoelectric material on the first electrode.

According to another example, the first electrode 121 may be formed of a molybdenum (Mo) material, but is not limited thereto. For example, various metals such as gold, ruthenium, aluminum, platinum, titanium, tungsten, palladium, chrome, nickel, iridium, and the like may be used.

Further, according to one example, the piezoelectric layer 123 may be formed of aluminum nitride (AlN), but is not limited thereto. For example, various piezoelectric materials such as zinc oxide (ZnO), silicon dioxide ($SiO_2$), doped zinc oxide (e.g., W—ZnO), doped aluminum nitride (e.g., Sc—AlN, MgZr—AlN, Cr—AlN, Er—AlN, Y—AlN), and the like may be used.

In this example, the first electrode 121 and the piezoelectric layer 123 may be formed in a predetermined pattern by depositing a photoresist on the conductive layer or the piezoelectric layer, performing the patterning using a photolithography process, and then removing unnecessary portions using the patterned photoresist as a mask.

Thereby, the piezoelectric layer 123 may be left on only the first electrode 121. As a result, the first electrode may be left to further protrude around the piezoelectric layer 123.

Next, the second electrode 122 may be formed.

The second electrode 122 may be formed in a predetermined pattern by forming the conductive layer on the piezoelectric layer 123 and the first electrode 121, depositing the photoresist on the conductive layer, performing the patterning using the photolithography process, and then removing unnecessary portions using the patterned photoresist as the mask.

According to another example, the second electrode 122 may be formed of ruthenium (Ru), but is not limited thereto. For example, various metals such as gold, molybdenum, aluminum, platinum, titanium, tungsten, palladium, chrome, nickel, iridium, and the like may be used.

The protection layer 124 may also be formed on the second electrode 122 and the piezoelectric layer 123.

Further, the first connection part 180 and the second connection part 190 may penetrate through the protection layer 124 to be bonded to the first electrode 121 and the second electrode 122, respectively.

After confirming characteristics of the resonating part 120 or the filter and performing any necessary frequency trimming using the connection parts 180 and 190, the air gap 130 may be formed.

The air gap 130 may be formed by removing the sacrificial layer as described above. As a result, the resonating part 120 according to another example may be completed.

In this example, the sacrificial layer may be removed by a dry etching, but the present description is not limited thereto.

According to one example, the sacrificial layer is formed of polysilicon.

Such a sacrificial layer may be removed by using a dry etching gas such as xenon difluoride ($XeF_2$).

When the air gap 130 is formed by etching the sacrificial layer, in the event that the membrane 150 is formed of a plurality of membrane layers, a second membrane layer 152 formed on a first membrane layer 151 may serve as an etching stopper to protect the plurality of seed layers 140 formed on the second membrane layer 152 from being etched.

The first membrane layer 151 may be formed of, for example, silicon dioxide ($SiO_2$), or the like, and the second membrane layer 152 may be formed of, for example, silicon nitride ($SiN_x$), or the like. However, the present description are not limited thereto.

Meanwhile, the acoustic resonator and the method of manufacturing the same according to the present description are not limited to the above-mentioned embodiments, and may be variously modified.

As set forth above, according to an example of an acoustic resonator, because high crystallinity of the piezoelectric layer may be secured, the loss in the acoustic wave may be significantly reduced, and the kt2 value and performance of the acoustic resonator may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
    a resonating part comprising a first electrode, a second electrode, and a piezoelectric layer disposed between the first electrode and the second electrode; and
    a plurality of seed layers disposed on one side of the resonating part,
    wherein the plurality of seed layers comprise a first seed layer and a second seed layer,
    wherein an upper surface of the second seed layer corresponds to a (002) plane of hexagonal lattice.

2. The acoustic resonator of claim 1, further comprising a substrate disposed on the opposite side of the plurality of seed layers from the resonating part.

3. The acoustic resonator of claim 2, wherein an air gap is disposed between the substrate and the plurality of seed layers.

4. The acoustic resonator of claim 2, wherein the resonating part further comprises a protection layer.

5. The acoustic resonator of claim 2, wherein a membrane is interposed between the substrate and the plurality of seed layers, and
    an air gap is disposed between the substrate and the membrane.

6. The acoustic resonator of claim 5, wherein the membrane comprises a plurality of membrane layers, and
    at least one membrane layer of the plurality of membrane layers is an etching stopper.

7. The acoustic resonator of claim 1, wherein
    the first seed layer comprises a material having the same crystalline system as a material of the piezoelectric layer, and
    wherein the second seed layer comprises a material having the same unit cell geometry as a material of the first seed layer.

8. The acoustic resonator of claim 7, wherein a thickness of the first seed layer or the second seed layer is within a range of 10 Å to 1,000 Å.

9. The acoustic resonator of claim 7, wherein the piezoelectric layer, the first seed layer, and the second seed layer each comprise a material having a hexagonal crystal system.

10. The acoustic resonator of claim 9, wherein the second seed layer comprises a material having a hexagonal close packed structure.

11. The acoustic resonator of claim 9, wherein the piezoelectric layer comprises aluminum nitride or doped aluminum nitride,
    the first electrode comprises molybdenum,
    the first seed layer comprises aluminum nitride, and
    the second seed layer comprises titanium.

12. The acoustic resonator of claim 1, wherein the piezoelectric layer comprises aluminum nitride or doped aluminum nitride,
    the first electrode comprises molybdenum,
    the first seed layer comprises titanium, and
    the second seed layer comprises aluminum nitride.

13. An acoustic resonator comprising:
    a resonating part comprising a first electrode, a second electrode, and a piezoelectric layer disposed between the first electrode and the second electrode; and
    a plurality of seed layers disposed on one side of the resonating part,
    wherein a first seed layer and a second seed layer of the plurality of seed layers, and the piezoelectric layer each comprise a material having a hexagonal crystal system.

14. The acoustic resonator of claim 13, wherein the second seed layer comprises a material having a hexagonal close packed structure.

15. The acoustic resonator of claim 13, wherein the piezoelectric layer comprises aluminum nitride or doped aluminum nitride,
    the first electrode comprises molybdenum,
    the first seed layer comprises aluminum nitride, and
    the second seed layer comprises titanium.

16. The acoustic resonator of claim 13, wherein the piezoelectric layer comprises aluminum nitride or doped aluminum nitride,
    the first electrode comprises molybdenum,
    the first seed layer comprises titanium, and
    the second seed layer comprises aluminum nitride.

17. An acoustic resonator comprising:
    a resonating part comprising a first electrode, a second electrode, and a piezoelectric layer disposed between the first electrode and the second electrode;
    a plurality of seed layers disposed on one side of the resonating part, comprising a first seed layer and a second seed layer;
    a substrate disposed on the opposite side of the plurality of seed layers from the resonating part; and
    a plurality of membrane layers interposed between the substrate and the plurality of seed layers,
    wherein a lattice mismatch between the first seed layer and the second seed layer is less than or equal to 12.45%.

* * * * *